(12) United States Patent
Koiwa

(10) Patent No.: US 6,297,120 B1
(45) Date of Patent: Oct. 2, 2001

(54) METHOD OF MANUFACTURING A SEMICONDUCTOR DEVICE

(75) Inventor: Sumio Koiwa, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/326,150

(22) Filed: Jun. 4, 1999

(30) Foreign Application Priority Data

Jun. 5, 1998 (JP) .................................................. 10-157716
Feb. 12, 1999 (JP) .................................................. 11-034821
Mar. 11, 1999 (JP) .................................................. 11-065560

(51) Int. Cl.$^7$ .................................................. H01L 21/331
(52) U.S. Cl. ....................................... 438/358; 438/621
(58) Field of Search ................................. 438/307, 358, 438/363, 369, 584, 621, 370, 627, 643, 914

(56) References Cited

U.S. PATENT DOCUMENTS 4,791,074 * 12/1988 Tsunashima et al. ................ 437/160
5,970,355 * 10/1999 Kim ....................................... 438/309
5,989,996 * 11/1999 Kishi .................................... 438/621

* cited by examiner

*Primary Examiner*—David Nelms
*Assistant Examiner*—David Nhu
(74) *Attorney, Agent, or Firm*—Adams & Wilks

(57) ABSTRACT

To provide a method of manufacturing a semiconductor device in which an epitaxial growth film is formed on a semiconductor substrate having a buried layer, which is capable of reducing the manufacturing time of the semiconductor device or reducing the IC chip area. The method of manufacturing a semiconductor device is characterized by including a process of selecting the concentration of the p-type conductive impurities which put the surface of the silicon semiconductor substrate into a full amorphous state and conducting doping with the impurities.

30 Claims, 7 Drawing Sheets

METHOD OF MANUFACTURING A SEMICONDUCTOR DEVICE

BACKGROUND OF THE INVENTION

1. Field of the Invention

The present invention relates to a semiconductor device, and more particularly to a method of manufacturing a semiconductor device with the semiconductor substrate using an epitaxial growth film.

2. Description of the Related Art

Up to now, in all or a partial region of a semiconductor substrate using an epitaxial growth film, a buried layer is disposed under said epitaxial growth film. The buried layer is used for lowering a resistance of the device formed on the buried layer and also for improving a soft error and latch-up resistance.

Also, in the case where an IC using a bipolar device or a BiCMOS device is formed on the semiconductor substrate having the epitaxial growth film, the buried layer is brought into contact with an impurity diffused layer of the same conductivity as that of said buried layer formed on the epitaxial growth film to separate device elements.

FIG. 1 is a cross-sectional view showing a semiconductor substrate with a buried layer using an epitaxial growth film according to a conventional method of manufacturing a semiconductor device.

In FIG. 1, a silicon semiconductor substrate 101 is doped with impurities through an ion implantation method. A device element separation region is doped with impurities of the same conductivity as that of the silicon semiconductor substrate 101. Annealing is conducted in order to diffuse the impurities with which doping is made through the ion implantation method and to restore crystal defects introduced into the silicon semiconductor substrate 101 through the ion implantation method. After an epitaxial growth film 102 has been formed on the silicon semiconductor substrate 101 that has been annealed, the epitaxial growth film 102 is doped with impurities. The impurities with which the device element separation region is doped are of the same conductivity as that of the silicon semiconductor substrate 101 and a buried layer 103. The silicon semiconductor substrate 101 on which the epitaxial growth film 102 that is doped with the impurities is formed is annealed, to thereby thermally diffuse the impurities with which the epitaxial growth film 102 is doped and the buried layer 103, thus forming a diffusion layer 104 and the buried layer 103. In the device element separation region, the buried layer 103 and the diffusion layer 104 come in contact with each other, to thereby perform the electric separation of the device elements.

In the semiconductor device manufactured according to the above-described conventional manufacturing method, it is essential to conduct annealing in order to restore the crystal defects introduced into the surface of the semiconductor substrate which is caused by doping the semiconductor substrate with the impurities before the formation of the epitaxial growth film on the semiconductor substrate having the buried layer. Since the p-type conductive impurities make it more difficult to restore the crystal defects introduced into the semiconductor substrate than the n-type conductive impurities, the annealing conditions (temperature, a period of time) are determined according to the doping conditions (concentration, an energy and ion species) of the p-type conductive impurities. In the case where the annealing is conducted under the doping conditions of the p-type conductive impurities, there arises such a problem that it is difficult to reduce an IC chip area because the amount of thermal diffusion of the buried layer is large.

If the concentration of the p-type conductive impurities with which the semiconductor substrate is doped is lowered, it is possible to restrain the amount of diffusion of the buried layer because the quantity of annealing heat is lowered. However, the resistance is increased in the device regions, and the diffusion layer and the buried layer formed in the epitaxial growth layer become out of contact with each other in the device element separation region, resulting in such a problem that the device element separation is impossible.

If the concentration of the impurities with which the diffusion layer is doped is heightened, it is possible to restrain the high resistance of the device regions. However, this leads to such problems that the IC chip area increases, and also that the device characteristics are deteriorated by the high concentration of the impurities in the device region.

If the quantity of annealing heat for forming the diffusion layer and the buried layer is increased, it is possible to form the structure in which the device elements are electrically separated in the device element separation region. However, there arises such a problem that the IC chip area increases or the manufacturing costs increase as in the case where the concentration of the impurities with which the diffusion layer is doped.

Similarly, if the concentration of the impurities with which the device region and the device element separation region of the semiconductor substrate are doped is varied, it is possible to restrain the high resistance in the device region and to form the structure in which the device elements are electrically separated in the device element separation region. However, there arises such a problem that an increase of a masking process causes to increase the IC manufacturing costs.

The present invention has been made in view of the above circumstances, and therefore an object of the present invention is to provide a method of manufacturing a semiconductor device that makes it possible to reduce a period of time for manufacturing the semiconductor device more and to reduce the IC chip area more than the conventional method of manufacturing the semiconductor device in which the epitaxial growth film is formed on the semiconductor substrate having the buried layer.

SUMMARY OF THE INVENTION

In order to solve the above problems, the present invention provides the following means.

(1) A method of manufacturing a semiconductor device, characterized by comprising the steps of: doping all or a partial region of a semiconductor substrate with p-type conductive impurities; annealing the semiconductor substrate; forming an epitaxial growth film on the semiconductor substrate; doping the epitaxial growth film with impurities; and annealing the semiconductor substrate doped with the impurities.

(2) A method of manufacturing a semiconductor device, characterized by comprising the steps of: doping all or a partial region of a semiconductor substrate with an inert substance; doping at least a part of the all or a partial region of the substrate which has been doped with the inert substance with p-type conductive impurities; annealing the semiconductor substrate; forming an epitaxial growth film on the semiconductor substrate; doping the epitaxial growth film with impurities; and annealing the semiconductor substrate doped with the impurities.

(3) A method of manufacturing a semiconductor device, characterized by comprising the steps of: doping all or a partial region of a semiconductor substrate with p-type conductive impurities; forming an epitaxial growth film on the semiconductor substrate; doping the epitaxial growth film with impurities; and annealing the semiconductor substrate doped with said impurities.

(4) A method of manufacturing a semiconductor device, characterized in that the step of doping all or a partial region of the semiconductor substrate with p-type conductive impurities is achieved by using an ion implantation method.

(5) A method of manufacturing a semiconductor device, characterized in that the step of doping all or a partial region of the semiconductor substrate with the inert substance is achieved by using an ion implantation method.

(6) A method of manufacturing a semiconductor device, characterized in that the step of doping all or a partial region of the semiconductor substrate with the p-type conductive impurities is achieved by using a pre-deposition method.

(7) A method of manufacturing a semiconductor device, characterized in that the step of doping all or a partial region of the semiconductor substrate with the p-type conductive impurities is achieved by using an MLD (molecular layer doping) method.

DETAILED DESCRIPTION OF THE INVENTION

Hereinafter, a description will be given of the embodiments of the present invention with reference to the drawings.

Figure 1:
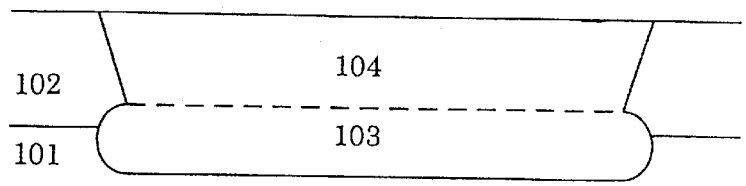
FIG. 1 is a schematic cross-sectional view showing a semiconductor device manufactured through a conventional manufacturing method.
Figure 2:
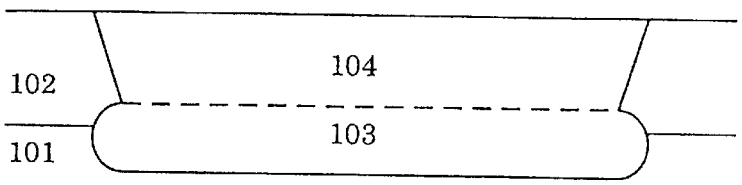
FIG. 2 is a schematic cross-sectional view showing a semiconductor device manufactured through a manufacturing method according to a first embodiment of the present invention.

FIG. 2 is a schematic cross-sectional view showing a semiconductor device in a manufacturing method according to a first embodiment of the present invention. Referring to FIG. 2, all or a partial region of a silicon semiconductor substrate 101, for example, a p-type conductive silicon semiconductor substrate 20 to 30 Ω-cm in the resistivity is doped with p-type conductive impurities, for example, boron at the concentration of $1 \times 10^{16}$ to $1 \times 10^{21}$ atms/cm$^3$, preferably, $1 \times 10^{16}$ to $1 \times 10^{20}$ atms/cm$^3$, more preferably, $1 \times 10^{19}$ atms/cm$^3$, for the purpose of lowering the resistance of a device formed on an epitaxial growth film 102 and improving a soft error and a latch-up resistance, through the ion implantation method, and is subjected to an annealing process, for example, is annealed at 1175° C. for 3 hours, to thereby restore a doping damage introduced into the silicon semiconductor substrate 101.

The epitaxial growth film 102, for example, a CVD epitaxial growth film of the n-type conductivity using SiH$_2$Cl$_2$ and PH$_3$ as a gas source is formed in the resistivity of 2 Ω-cm and the film thickness of 9 μm on the silicon semiconductor substrate 101 which has been annealed. All or a partial region of the epitaxial growth film 102 on the silicon semiconductor substrate 101 is doped with p-type conductive impurities, for example, boron at the concentration of $1 \times 10^{16}$ to $1 \times 10^{18}$ atms/cm$^3$, more preferably, $1 \times 10^{17}$ atms/cm$^3$, and is then subjected to an annealing process, for example, is annealed at 1100° C. for 6 hours, to thereby form a buried layer 103 and a diffusion layer 104. In this situation, the buried layer 103 and the diffusion layer 104 come in contact with each other due to the annealing. As a result, the structure in which the device elements are electrically separated is formed.

Figure 3:
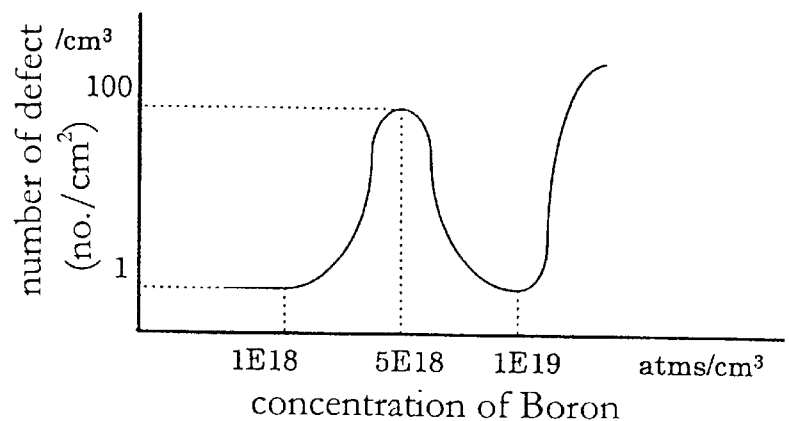
FIG. 3 is a graph showing a relation between the concentration of impurities with which the silicon semiconductor substrate has been doped through the ion implantation method and the number of crystal defects on the surface of the silicon semiconductor substrate which has been annealed.

FIG. 3 is a graph showing a relation between the concentration of boron with which the silicon semiconductor substrate has been doped through the ion implantation method and the number of crystal defects on the surface of the silicon semiconductor substrate when it has been annealed at 1175° C. for 3 hours after being doped with boron.

Referring to FIG. 3, the number of crystal defects on the surface of the silicon semiconductor substrate has a tendency to increase until the concentration of boron becomes $1 \times 10^{19}$ atms/cm$^3$ to $5 \times 10^{18}$ atms/cm$^3$, has a peak with the concentration of boron being $5\times10^{18}$ atms/cm$^3$, has a tendency to decrease until the concentration of boron becomes $1\times10^{19}$ atms/cm$^3$, has a peak with the concentration of boron being $1\times10^{19}$ atms/cm$^3$, and again has a tendency to increase at the concentration of boron being $1\times10^{19}$ atms/cm$^3$ or higher.

Because the p-type conductive impurities employed through the ion implantation method, for example, boron is smaller in atomic weight then the n-type conductive impurities, for example, arsenic, the doping damage of the ion implantation to the silicon semiconductor substrate is small. Comparing the surface state of the silicon semiconductor substrate which have been ion-implanted with the p-type conductive impurities with the surface state of the n-type conductive impurities at the same concentration, the surface of the semiconductor substrate which has been doped with the n-type conductive impurities is in a full amorphous state whereas the surface of the semiconductor substrate which has been doped with the p-type conductive impurities may be in a semi-amorphous state. In the case where the epitaxial growth film is formed on the silicon semiconductor substrate, it is necessary to mono-crystallize the surface of the silicon semiconductor substrate which has been put into an amorphous state through the ion implantation by annealing the silicon semiconductor substrate before conducting the epitaxial growth. In the case where the crystal state of the surface of the silicon semiconductor substrate is restored by annealing, recrystallization is easier when the surface state of the silicon semiconductor substrate is in the full amorphous state.

According to the present invention, since the concentration of the p-type conductive impurities which put the surface of the silicon semiconductor substrate in the full amorphous state is selected and the silicon semiconductor substrate is doped with such impurities, the doping damage introduced into the silicon semiconductor substrate is readily restored, and the quantity of heat of annealing which is conducted before epitaxial growth can be restrained. In the case where the annealing temperature is lowered, the amount of thermal diffusion in the respective diffusion layers can be restrained, and in the case where the annealing period of time is shortened, the manufacturing TAT can be reduced.

Figure 4:
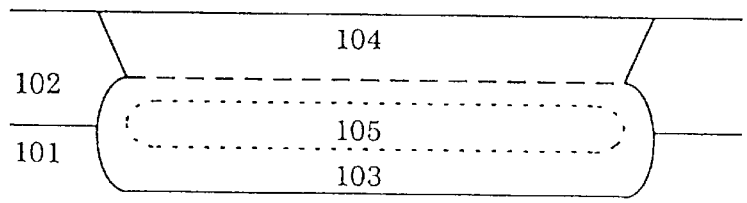
FIG. 4 is a schematic cross-sectional view showing a semiconductor substrate manufactured through a manufacturing method according to a second embodiment of the present invention.

FIG. 4 is a schematic cross-sectional view showing a semiconductor device in a manufacturing method according to a second embodiment of the present invention.

Referring to FIG. 4, all or a partial region of a silicon semiconductor substrate 101, for example, a p-type conductive silicon semiconductor substrate 20 to 30 Ω-cm in the resistivity is doped with an inert substance, for example, argon at the dose amount of $1\times10^{15}$ atms/cm$^3$ through the ion implantation method to form a region 105, and all or a partial region of the silicon semiconductor substrate 101, at least a region doped with the inert substance is doped with p-type conductive impurities, for example, boron at the concentration of $1\times10^{16}$ to $1\times10^{21}$ atms/cm$^3$, preferably, $1\times10^{18}$ to $1\times10^{20}$ atms/cm$^3$, more preferably, $1\times10^{19}$ atms/cm$^3$, for the purpose of lowering the resistance of a device formed on an epitaxial growth film 102 and improving a soft error and a latch-up resistance, through the ion implantation method, and is subjected to an annealing process, for example, is annealed at 1175° C. for 3 hours, to thereby restore a doping damage introduced into the silicon semiconductor substrate 101.

The epitaxial growth film 102, for example, a CVD epitaxial growth film of the n-type conductivity using SiH$_2$Cl$_2$ and PH$_3$ as a gas source is formed in the resistivity of 2 Ω-cm and the film thickness of 9 μm on the silicon semiconductor substrate 101 which has been annealed. All or a partial region of the epitaxial growth film 102 on the silicon semiconductor substrate 101 is doped with p-type conductive impurities, for example, boron at the concentration of $1\times10^{16}$ to $1\times10^{18}$ atms/cm$^3$, more preferably, $1\times10^{17}$ atms/cm$^3$, and is then subjected to an annealing process, for example, is annealed at 1100° C. for 6 hours, to thereby form a buried layer 103 and a diffusion layer 104. In this situation, the buried layer 103 and the diffusion layer 104 come in contact with each other due to the annealing. As a result, the structure in which the device elements are electrically separated is formed.

Figure 5:
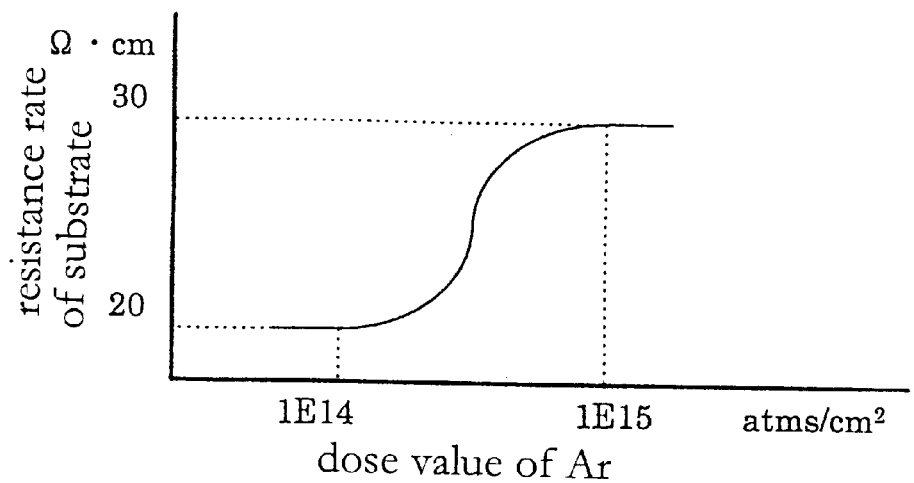
FIG. 5 is a graph showing a relation between the concentration of an inert substance with which the silicon semiconductor substrate has been doped through the ion implantation method and the resistivity of the silicon semiconductor substrate.

FIG. 5 is a graph showing a relation between the concentration of argon with which the silicon semiconductor substrate has been doped through the ion implantation method and the resistivity of the silicon semiconductor substrate which has been doped with argon.

Referring to FIG. 5, the resistivity of the silicon semiconductor substrate has a tendency to increase until the dose amount of argon becomes $1\times10^{14}$ atms/cm$^2$ to $1\times10^{15}$ atms/cm$^2$, and becomes substantially constant with the dose amount of argon being $1\times10^{15}$ atms/cm$^2$ or higher. This exhibits that the surface of the amorphous semiconductor substrate starts to be put into the amorphous state through the argon implantation of the silicon semiconductor substrate when the dose amount of argon is $1\times10^{14}$ atms/cm$^2$, and is put into the full amorphous state when the dose amount of argon is $1\times10^{15}$ atms/cm$^2$. Accordingly, if the dose amount of argon is $1\times10^{15}$ atms/cm$^2$, the surface of the silicon semiconductor substrate is put into the full amorphous state regardless of the fact that doping of the silicon semiconductor substrate with the impurities is conducted or not.

In the case where the epitaxial growth film is formed on the silicon semiconductor substrate, it is necessary to recrystallize the surface of the silicon semiconductor substrate which has been put into an amorphous state through the ion implantation by annealing the silicon semiconductor substrate before conducting the epitaxial growth. In the case where the crystal state of the surface of the silicon semiconductor substrate is restored by annealing, recrystallization is easier when the surface state of the silicon semiconductor substrate is in the full amorphous state.

According to the present invention, since the concentration of the inert substance which puts the surface of the silicon semiconductor substrate in the full amorphous state is selected and the silicon semiconductor substrate is doped with such inert substance, the doping damage introduced into the silicon semiconductor substrate is readily restored, and the quantity of heat of annealing which is conducted before epitaxial growth can be restrained. In the case where the annealing temperature is lowered, the amount of thermal diffusion in the respective diffusion layers can be restrained, and in the case where the annealing period of time is shortened, the manufacturing TAT can be reduced.

Figure 6:
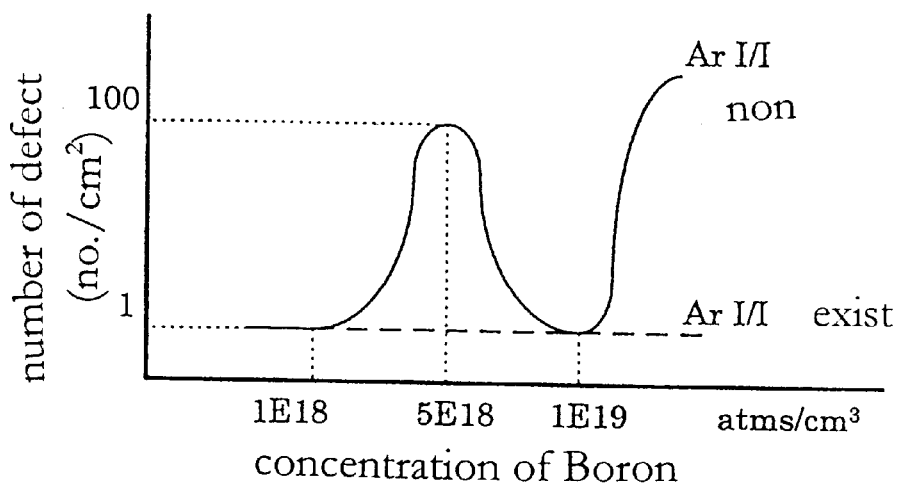
FIG. 6 is a graph showing a relation between the concentration of impurities and an inert substance with which the silicon semiconductor substrate has been doped through the ion implantation method and the number of crystal defects on the surface of the silicon semiconductor substrate which has been annealed.

FIG. 6 is a graph showing a relation between the concentration of boron with which the silicon semiconductor substrate has been doped through the ion implantation method and the number of crystal defects on the surface of the silicon semiconductor substrate when it has been annealed at 1175° C. for 3 hours after being doped with boron and argon. FIG. 6 shows that there is no crystal defect in the silicon semiconductor substrate without depending on the concentration of boron due to Ar doping.

It is needless to say that it is acceptable that the dose amount of argon is $1\times10^{25}$ atms/cm$^2$ or less since the concentration or argon and the p-type conductive impurities which put the surface of the silicon semiconductor substrate into the full amorphous state is adjusted taking the concentration of impurities with which the silicon semiconductor substrate is doped into consideration.

Figure 7:
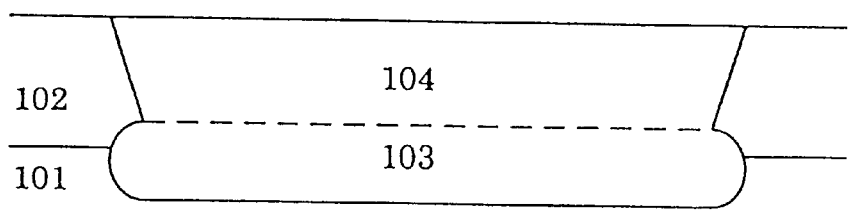
FIG. 7 is a schematic cross-sectional view showing a semiconductor device manufactured through a manufacturing method according to a third embodiment of the present invention.

FIG. 7 is a schematic cross-sectional view showing a semiconductor device in a manufacturing method according to a third embodiment of the present invention. Referring to FIG. 7, all or a partial region of a silicon semiconductor substrate 101, for example, a p-type conductivity silicon semiconductor substrate 20 to 30 Ω-cm in the resistivity is doped with p-type conductive impurities, for example, boron at the concentration of $1 \times 10^{20}$ atms/cm$^3$ to $1 \times 10^{22}$ atms/cm$^3$ through the pre-deposition method, so that the epitaxial growth film 102, for example, a CVD epitaxial growth film of the n-type conductivity using SiH$_2$Cl$_2$ and PH$_3$ as a gas source is formed in the resistivity of 2 Ω-cm and the film thickness of 9 μm on the silicon semiconductor substrate 101. All or a partial region of the epitaxial growth film 102 on the silicon semiconductor substrate 101 is doped with p-type conductive impurities, for example, boron at the concentration of $1 \times 10^{16}$ to $1 \times 10^{18}$ atms/cm$^3$, more preferably, $1 \times 10^{17}$ atms/cm$^3$, and is then subjected to an annealing process, for example, is annealed at 1100° C. for 6 hours, to thereby form a buried layer 103 and a diffusion layer 104. In this situation, the buried layer 103 and the diffusion layer 104 come in contact with each other due to the annealing. As a result, the structure in which the device elements are electrically separated is formed.

Figure 8:
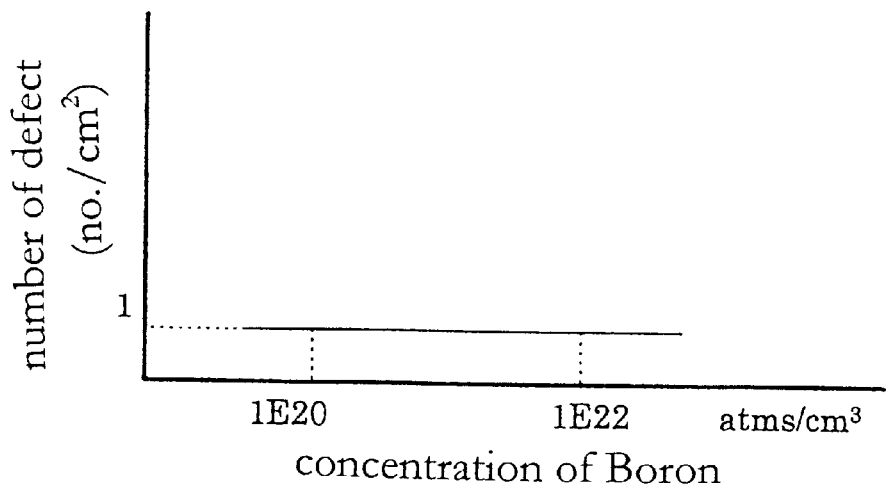
FIG. 8 is a graph showing a relation between the concentration of impurities with which the silicon semiconductor substrate has been doped through the pre-deposition method and the number of crystal defects on the surface of the silicon semiconductor substrate.

FIG. 8 is a graph showing a relation between the concentration of boron with which the silicon semiconductor substrate has been doped through the pre-deposition method and the number of crystal defects on the surface of the silicon semiconductor substrate which has been doped with boron. Referring to FIG. 8, the number of crystal defects on the surface of the silicon semiconductor substrate does not depend on the concentration of impurities with which the silicon semiconductor substrate is doped, and there is no doping damage in the silicon semiconductor substrate. Since the pre-deposition method thermally diffuses the impurities in the high-concentration impurity glass in the silicon semiconductor substrate through the solid-phase diffusion, there is no crystal defect introduced into the silicon semiconductor substrate due to the impurity doping.

Accordingly, since it is unnecessary to anneal the silicon semiconductor substrate doped with the buried layer through the pre-deposition method in order to restore the doping damage of the silicon semiconductor substrate after the impurity doping, the manufacturing TAT can be reduced as much as the annealing.

Figure 9:
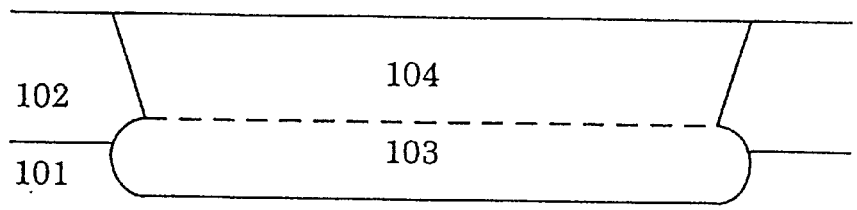
FIG. 9 is a schematic cross-sectional view showing a semiconductor device manufactured through a manufacturing method according to a fourth embodiment of the present invention.

FIG. 9 is a schematic cross-sectional view showing a semiconductor device in a manufacturing method according to a fourth embodiment of the present invention. Referring to FIG. 9, all or a partial region of a silicon semiconductor substrate 101, for example, a p-type conductive silicon semiconductor substrate 20 to 30 Ω-cm in the resistivity is doped with p-type conductive impurities, for example, boron at the concentration of $1 \times 10^{20}$ atms/cm$^3$ to $1 \times 10^{22}$ atms/cm$^3$ through the MLD (molecular layer doping) method, so that the epitaxial growth film 102, for example, a CVD epitaxial growth film of the n-type conductivity using SiH$_2$Cl$_2$ and PH$_3$ as a gas source is formed in the resistivity of 2 Ω-cm and the film thickness of 9 μm on the silicon semiconductor substrate 101. All or a partial region of the epitaxial growth film 102 on the silicon semiconductor substrate 101 is doped with p-type conductive impurities, for example, boron at the concentration of $1 \times 10^{16}$ to $1 \times 10^{18}$ atms/cm$^3$, more preferably, $1 \times 10^{17}$ atms/cm$^3$, and is then subjected to an annealing process, for example, is annealed at 1100° C. for 6 hours, to thereby form a buried layer 103 and a diffusion layer 104. In this situation, the buried layer 103 and the diffusion layer 104 come in contact with each other due to the annealing. As a result, the structure in which the device elements are electrically separated is formed.

Figure 10:
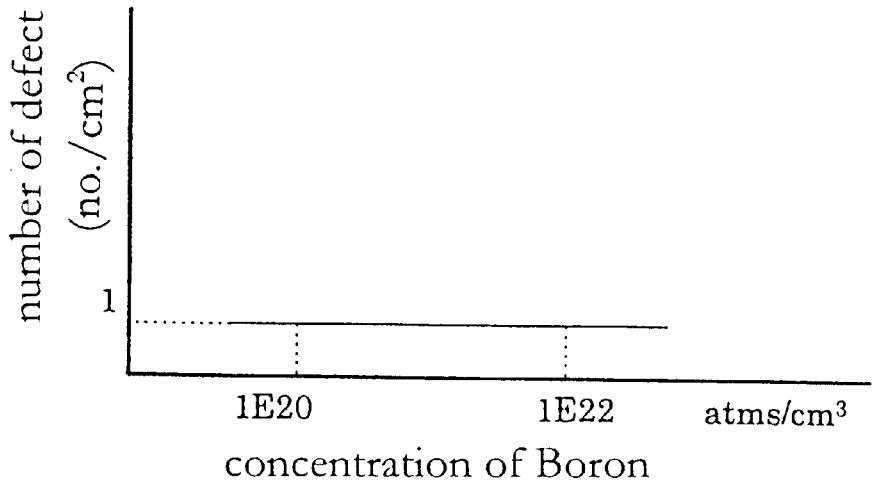
FIG. 10 is a graph showing a relation between the concentration of impurities with which the silicon semiconductor substrate has been doped through the MLD method and the number of crystal defects on the surface of the silicon semiconductor substrate.

FIG. 10 is a graph showing a relation between the concentration of boron with which the silicon semiconductor substrate has been doped through the MLD method and the number of crystal defects on the surface of the silicon semiconductor substrate which has been doped with boron.

Referring to FIG. 10, the number of crystal defects on the surface of the silicon semiconductor substrate does not depend on the concentration of impurities with which the silicon semiconductor substrate is doped, and there is no doping damage in the silicon semiconductor substrate. Since the MLD method thermally diffuses the impurities in the silicon semiconductor substrates using a method disclosed in, for example, Japanese Patent Unexamined Publication No. 403-173476, like the pre-deposition method but unlike ion implantation method, there is no crystal defect introduced into the silicon semiconductor substrate due to the impurity doping.

Accordingly, since it is unnecessary to anneal the silicon semiconductor substrate doped with the buried layer through the MLD method in order to restore the doping damage of the silicon semiconductor substrate after the impurity doping, the manufacturing TAT can be reduced as much as the annealing.

Also, in the case where the silicon semiconductor substrate is doped with the impurities through MLD method, the concentration in the buried layer can be controlled at higher accuracy than the pre-deposition method.

Incidentally, in the first, second, third and fourth embodiments of the semiconductor manufacturing device according to the manufacturing method of the present invention, boron may be replaced by BF$_2$ as the p-type conductive impurities with which the silicon semiconductor substrate is doped.

In the second embodiment of the semiconductor manufacturing device according to the manufacturing method of the present invention, the inert substance with which the silicon semiconductor substrate is doped is not limited to argon but may be other inert substances.

In the first, second, third and fourth embodiments of the semiconductor manufacturing device according to the manufacturing method of the present invention, the n-type conductive silicon semiconductor substrate may be used instead of the p-type conductive silicon semiconductor substrate for the silicon semiconductor substrate. Also, the resistivity of the substrate is not limited to 20 to 30 Ω-cm, but the silicon semiconductor substrate of another resistivity, for example, 5 to 10 Ω-cm may be used.

In the first, second, third and fourth embodiments of the semiconductor manufacturing device according to the manufacturing method of the present invention, the film thickness of the epitaxial growth formed on the silicon semiconductor substrate is not limited to 9 μm but selectable to an arbitrary value. It is needless to say after the epitaxial growth film has been formed with the selected epitaxial growth film,thickness, the concentration of impurities to be doped or the quantity of annealing heat may be selected.

FIG. 11 is a cross-sectional view showing a method of manufacturing the semiconductor device according to the present invention in a first process order. FIG. 11(a) shows an appearance in which a thermal oxide film 106 is formed in thickness of 10000 Å on the silicon semiconductor substrate 101, and a location where the buried layer 103 is formed is patterned by etching.

Figure 11A:
FIGS. 11a–11e are a cross-sectional view showing a first process order in a manufacturing method according to the present invention.
Figure 11B:
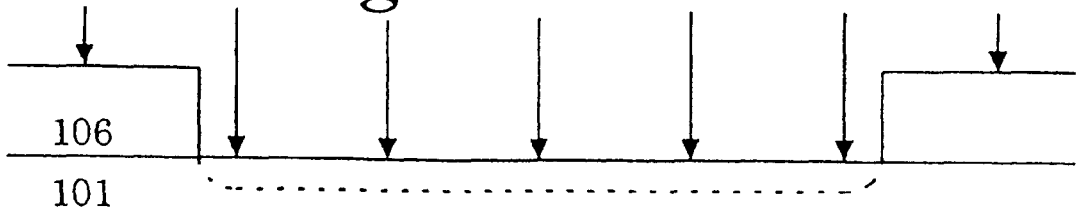

FIG. 11(b) shows an appearance in which the silicon semiconductor substrate 101 is doped with p-type conductive impurities through the ion implantation method.

Figure 11C:
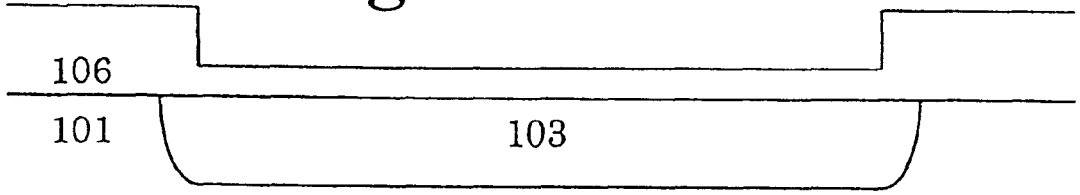

FIG. 11(c) shows an appearance in which annealing is conducted to thermally diffuse the impurities doped in FIG. 11(b) and also to restore the doping damage on the silicon semiconductor substrate 101.

Figure 11D:
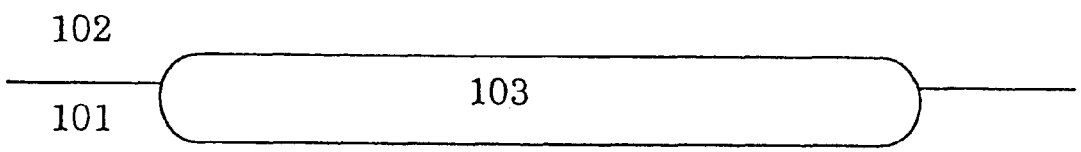

FIG. 11(d) shows an appearance in which the thermal oxide film 106 on the silicon semiconductor substrate 101 is removed by etching and the epitaxial growth film 102 is formed on the silicon semiconductor substrate 101.

Figure 11E:
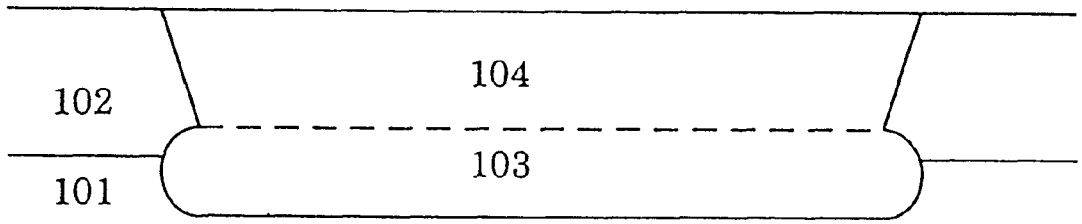

FIG. 11(e) shows an appearance in which the epitaxial growth film 102 is doped with the impurities and then annealed to form the buried layer 103 and the diffusion layer 104.

FIG. 12 is a cross-sectional view showing a method of manufacturing the semiconductor device according to the present invention in a second process order. FIG. 12(a) shows an appearance in which a thermal oxide film 106 is formed in thickness of 10000 Å on the silicon semiconductor substrate 101, and a location where the buried layer 103 is formed is patterned by etching.

Figure 12A:
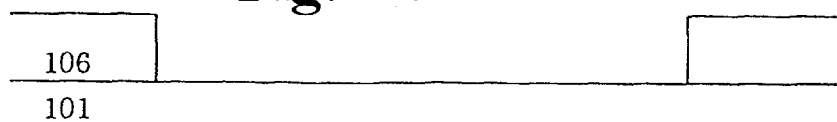
FIGS. 12a–12f are a cross-sectional view showing a second process order in a manufacturing method according to the present invention.
Figure 12B:
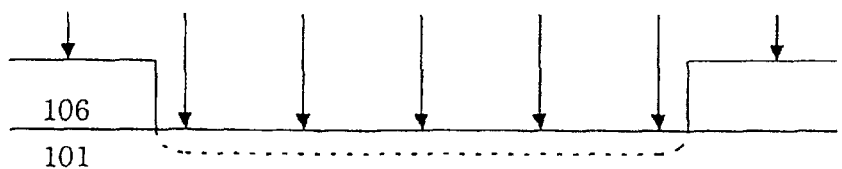

FIG. 12(b) shows an appearance in which the silicon semiconductor substrate 101 is doped with an inert substance through the ion implantation method.

Figure 12C:
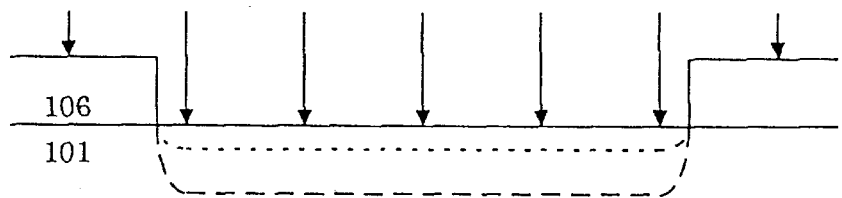

FIG. 12(c) shows an appearance in which the silicon semiconductor substrate 101 is doped with p-type conductive impurities through the ion implantation method.

Figure 12D:
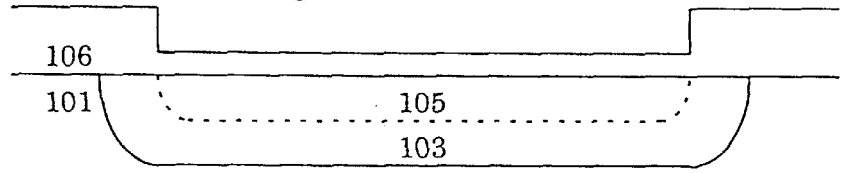

FIG. 12(d) shows an appearance in which annealing is conducted to thermally diffuse the inert substance and impurities doped in FIGS. 12(b) and 12(c) and also to restore the doping damage to the silicon semiconductor substrate 101.

Figure 12E:
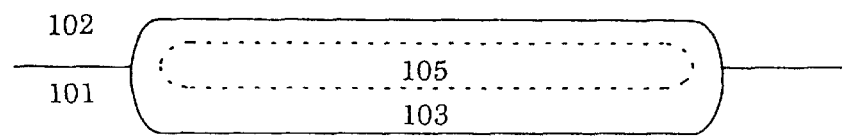

FIG. 12(e) shows an appearance in which the thermal oxide film 106 on the silicon semiconductor substrate 101 is removed by etching and the epitaxial growth film 102 is formed on the silicon semiconductor substrate 101.

Figure 12F:
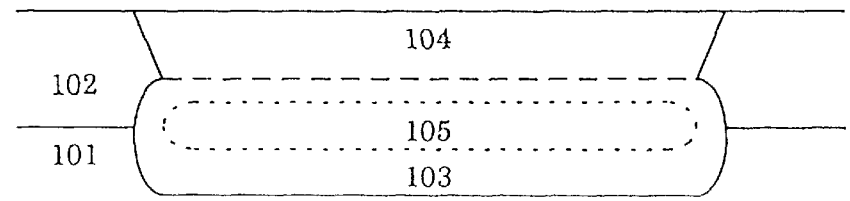

FIG. 12(f) shows an appearance in which the epitaxial growth film 102 is doped with the impurities and then annealed to form the buried layer 103 and the diffusion layer 104.

FIG. 13 is a cross-sectional view showing a method of manufacturing the semiconductor device according to the present invention in a third process order. FIG. 13(a) shows an appearance in which a thermal oxide film 106 is formed in thickness of 10000 Å on the silicon semiconductor substrate 101, and a location where the buried layer 103 is formed is patterned by etching.

Figure 13A:
FIGS. 13a–13d are a cross-sectional view showing a third process order in a manufacturing method according to the present invention.
Figure 13B:
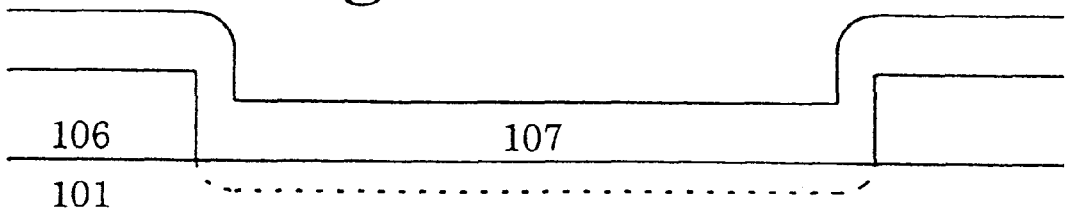

FIG. 13(b) shows an appearance in which the silicon semiconductor substrate 101 is doped with p-type conductive impurities through the pre-deposition method by forming a layer 107.

Figure 13C:
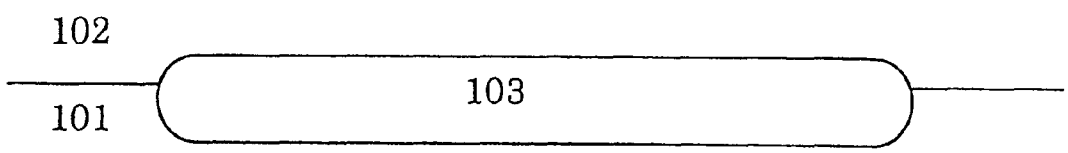

FIG. 13(c) shows an appearance in which the thermal oxide film 106 on the silicon semiconductor substrate 101 is removed by etching and the epitaxial growth film 102 is formed on the silicon semiconductor substrate 101.

Figure 13D:
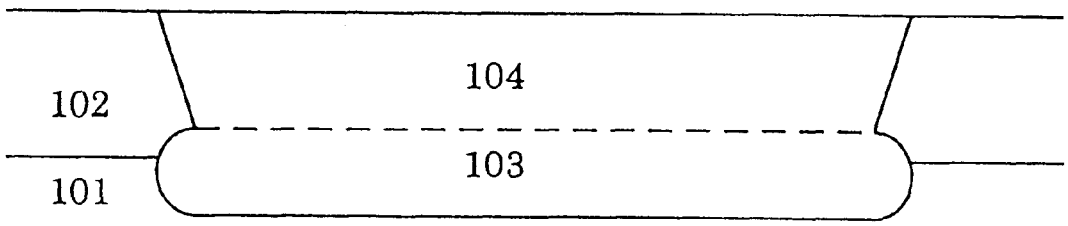

FIG. 13(d) shows an appearance in which the epitaxial growth film 102 is doped with the impurities and then annealed to form the buried layer 103 and the diffusion layer 104.

FIG. 14 is a cross-sectional view showing a method of manufacturing the semiconductor device according to the present invention in a fourth process order. FIG. 14(a) shows an appearance in which a thermal oxide film 106 is formed in thickness of 10000 Å on the silicon semiconductor substrate 101, and a location where the buried layer 103 is formed is patterned by etching.

Figure 14A:
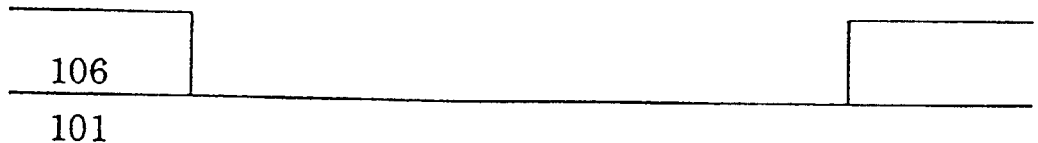
FIGS. 14a–14d are a cross-sectional view showing a fourth process order in a method of manufacturing the semiconductor device according to the present invention.
Figure 14B:
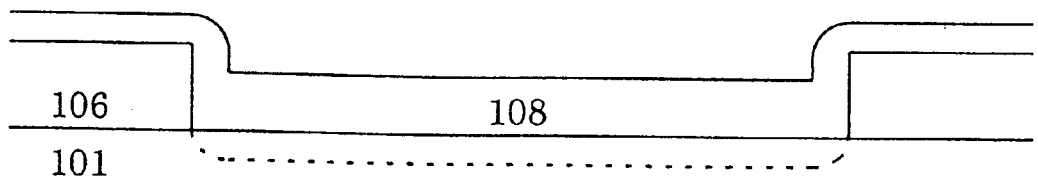

FIG. 14(b) shows an appearance in which the silicon semiconductor substrate 101 is doped with p-type conductive impurities through the MLD method by forming a layer 108.

Figure 14C:
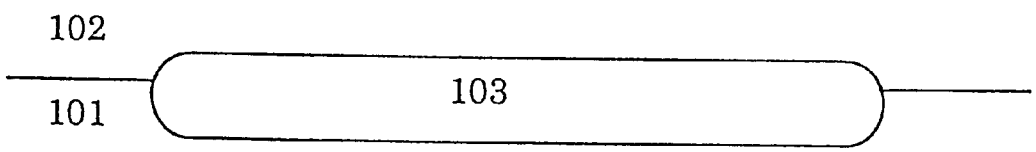

FIG. 14(c) shows an appearance in which the thermal oxide film 106 on the silicon semiconductor subtrate 101 is removed by etching and the epitaxial growth film 102 is formed on the silicon semiconductor substrate 101.

Figure 14D:
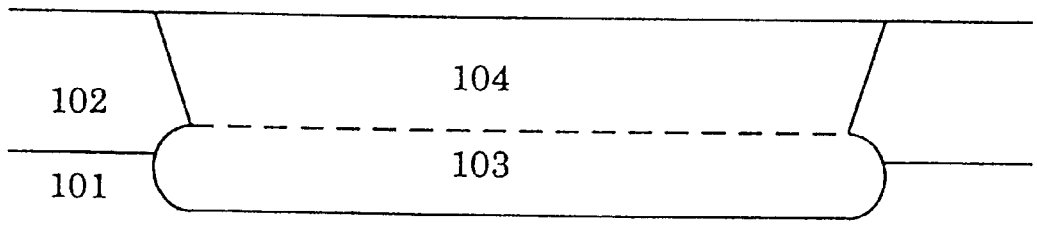

FIG. 14(d) shows an appearance in which the epitaxial growth film 102 is doped with the impurities and then annealed to form the buried layer 103 and the diffusion layer 104.

As described above, in the method of manufacturing the semiconductor device according to the present invention, the concentration of the p-type conductive impurities with which the silicon semiconductor substrate is doped through the ion implantation method is set at a concentration in which the surface of the silicon semiconductor substrate is put into a full amorphous state. As a result, the quantity of annealing heat for recrystallization of the silicon semiconductor substrate surface can be restrained, and the IC chip area can be reduced or the IC manufacturing TAT can be reduced. In particular, in the case where the silicon semiconductor substrate is doped with the inert substance through the ion implantation, there is no limit of the concentration of the p-type conductive impurities, the arbitrary concentration of the p-type conductive impurities can be selected, and further the IC chip area can be reduced or the IC manufacturing TAT can be reduced.

Also, in the case where the silicon semiconductor substrate is doped with the p-type conductive impurities through the pre-deposition method or the MLD method, because there is no doping damage introduced into the silicon semiconductor substrate which is different from a case in which the silicon semiconductor substrate is doped with the impurities through the ion implantation method, there is no need of conducting anneal for the purpose of recrystallizing the surface of the silicone semiconductor substrate. As a result, the IC chip area can be reduced or the IC manufacturing TAT can be reduced more as compared with the case in which the silicon semiconductor substrate is doped with the impurity through the ion implantation method.

If the doping of the silicon semiconductor substrate with the impurities is made through the MLD method, since the concentration in the buried layer can be controlled at higher accuracy than the pre-deposition method, the semiconductor device which is inexpensive and high in performance can be obtained.

What is claimed is:

1. A method of manufacturing a semiconductor device comprising the steps of: doping all or a region of a semiconductor substrate with p-type conductivity impurities so that the doped portion of the semiconductor substrate becomes fully amorphous; annealing the doped semiconductor substrate to repair the crystalline structure of the doped portion so that it becomes monocrystalline; forming an epitaxial growth film on the annealed semiconductor substrate; doping the epitaxial growth film with impurities; and annealing the semiconductor substrate having the epitaxial growth film doped with the impurities.

2. A method of manufacturing a semiconductor device comprising the steps of: doping all or a region of a semiconductor substrate with inert element atoms; doping at least a part of the region of the substrate which has been doped with the inert element atoms with p-type conductivity impurities so that the doped portion of the semiconductor substrate becomes fully amorphous; annealing the doped semiconductor substrate to repair the crystalline structure of the doped portion so that it becomes monocrystalline; forming an epitaxial growth film on the annealed semiconductor substrate; doping the epitaxial growth film with impurities: and annealing the semiconductor substrate having the epitaxial growth film doped with the impurities.

3. A method of manufacturing a semiconductor device comprising the steps of: doping all or a region of a semiconductor substrate with p-type conductivity impurities; forming an epitaxial growth film on the doped semiconductor substrate without annealing the doped semiconductor substrate after doping of the p-type conductivity impurities therein; doping the epitaxial growth film with impurities; and annealing the semiconductor substrate having the epitaxial growth film doped with the impurities.

4. A method of manufacturing a semiconductor device according to either of claim 1 or 2; wherein the step of doping all or a region of the semiconductor substrate with p-type conductivity impurities is performed by ion implantation.

5. A method of manufacturing a semiconductor device according to claim 2; wherein the step of doping all or a region of the semiconductor substrate with the inert element atoms is performed by ion implantation.

6. A method of manufacturing a semiconductor device according to claim 3; wherein the step of doping all or a partial region of the semiconductor substrate with the p-type conductivity impurities is performed by a pre-deposition method.

7. A method of manufacturing a semiconductor device according to claim 3; wherein the step of doping all or a partial region of the semiconductor substrate with the p-type conductivity impurities is performed by an MLD method.

8. A method of manufacturing a semiconductor device according to claim 1; wherein the semiconductor substrate has a p-type conductivity.

9. A method of manufacturing a semiconductor device according to claim 1; wherein the semiconductor substrate has a resistivity within the range of 20 to 30 $\Omega$-cm.

10. A method of manufacturing a semiconductor device according to claim 1; wherein step of doping all or a region of the semiconductor substrate with p-type impurities is performed by ion implantation of boron at a concentration within the range of $1\times10^{16}$ to $1\times10^{20}$ atoms/cm$^3$.

11. A method of manufacturing a semiconductor device according to claim 10; wherein the boron concentration is within the range of $1\times10^{18}$ to $1\times10^{20}$ atoms/cm$^3$.

12. A method of manufacturing a semiconductor device according to claim 1; wherein the step of annealing the doped semiconductor substrate is performed by heating the doped semiconductor substrate to 1175° C. for 3 hours.

13. A method of manufacturing a semiconductor device according to claim 1; wherein the step of forming an epitaxial growth film comprises the step of forming the epitaxial growth film by CVD.

14. A method of manufacturing a semiconductor device according to claim 13; wherein the CVD is performed using SiH$_2$Cl$_2$ and PH$_3$ as source gases.

15. A method of manufacturing a semiconductor device according to claim 14; wherein the step of forming the epitaxial growth film comprises forming the epitaxial growth film with a film thickness of 9 $\mu$m and a resistivity of 2 $\Omega$-cm.

16. A method of manufacturing a semiconductor device according to claim 2; wherein the semiconductor substrate has a p-type conductivity.

17. A method of manufacturing a semiconductor device according to claim 2; wherein the semiconductor substrate has a resistivity within the range of 20 to 30 $\Omega$-cm.

18. A method of manufacturing a semiconductor device according to claim 2; wherein step of doping all or a region of the semiconductor substrate with p-type impurities is performed by ion implantation of boron at a concentration within the range of $1\times10^{16}$ to $1\times10^{20}$ atoms/cm$^3$.

19. A method of manufacturing a semiconductor device according to claim 18; wherein the boron concentration is within the range of $1\times10^{18}$ to $1\times10^{20}$ atoms/cm$^3$.

20. A method of manufacturing a semiconductor device according to claim 2; wherein the step of annealing the doped semiconductor substrate is performed by heating the doped semiconductor substrate to 1175° C. for 3 hours.

21. A method of manufacturing a semiconductor device according to claim 2; wherein the step of forming an epitaxial growth film comprises the step of forming the epitaxial growth film by CVD.

22. A method of manufacturing a semiconductor device according to claim 21; wherein the CVD is performed using SiH$_2$Cl$_2$ and PH$_3$ as source gases.

23. A method of manufacturing a semiconductor device according to claim 22; wherein the step of forming the epitaxial growth film comprises forming the epitaxial growth film with a film thickness of 9 $\mu$m and a resistivity of 2 $\Omega$-cm.

24. A method of manufacturing a semiconductor device according to claim 3; wherein the semiconductor substrate has a p-type conductivity.

25. A method of manufacturing a semiconductor device according to claim 3; wherein the semiconductor substrate has a resistivity within the range of 20 to 30 $\Omega$-cm.

26. A method of manufacturing a semiconductor device according to claim 3; wherein step of doping all or a region of the semiconductor substrate with p-type impurities is performed so that the concentration of the impurities is within the range of $1\times10^{16}$ to $1\times10^{20}$ atoms/cm$^3$.

27. A method of manufacturing a semiconductor device according to claim 25; wherein the boron concentration is within the range of $1\times10^{18}$ to $1\times10^{20}$ atoms/cm$^3$.

28. A method of manufacturing a semiconductor device according to claim 3; wherein the step of annealing the semiconductor substrate having the epitaxial growth film doped with the impurities is performed by heating the semiconductor substrate to 1175° C. for 3 hours.

29. A method of manufacturing a semiconductor device according to claim 3; wherein the step of forming an epitaxial growth film comprises the step of forming the epitaxial growth film by CVD using SiH$_2$Cl$_2$ and PH$_3$ as source gases.

30. A method of manufacturing a semiconductor device according to claim 22; wherein the step of forming the epitaxial growth film comprises forming the epitaxial growth film with a film thickness 9 $\mu$m and a resistivity of 2 $\Omega$-cm.

* * * * *